(12) United States Patent
Yamamoto

(10) Patent No.: US 7,207,367 B2
(45) Date of Patent: Apr. 24, 2007

(54) METHOD AND APPARATUS FOR JOINING ADHESIVE TAPE

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 112 days.

(21) Appl. No.: 10/898,996

(22) Filed: Jul. 27, 2004

(65) Prior Publication Data
US 2005/0061425 A1  Mar. 24, 2005

(30) Foreign Application Priority Data
Sep. 24, 2003  (JP) ............................. 2003-331054

(51) Int. Cl.
*B26D 5/00* (2006.01)
*B26D 7/00* (2006.01)
(52) U.S. Cl. ............... 156/522; 156/515; 156/530; 156/540; 156/552; 156/574; 156/247; 156/248; 156/251; 156/264; 156/271; 242/615.2; 242/900; 226/190

(58) Field of Classification Search ............... 156/247, 156/248, 251, 264, 271, 515, 522, 530, 540, 156/552, 574; 242/900, 615.2; 226/190
See application file for complete search history.

(56) References Cited

U.S. PATENT DOCUMENTS 4,865,677 A * 9/1989 Matsushita et al. ......... 156/353
6,405,957 B1 * 6/2002 Alexander et al. .......... 242/346

FOREIGN PATENT DOCUMENTS

JP        2003-209084 A1    7/2003

* cited by examiner

*Primary Examiner*—Linda Gray
(74) *Attorney, Agent, or Firm*—Rader, Fishman & Grauer PLLC

(57) ABSTRACT

In an adhesive tape joining method for joining an adhesive tape to a surface of an article, cutting out the adhesive tape along an outer peripheral edge of the article and, then, collecting the unnecessary adhesive tape which has been cut out, the unnecessary adhesive tape is wound and collected so as not to shrink at a cut portion of the adhesive tape in a width direction.

6 Claims, 5 Drawing Sheets

METHOD AND APPARATUS FOR JOINING ADHESIVE TAPE

BACKGROUND OF THE INVENTION (1) Field of the Invention

The present invention relates to a method and an apparatus for joining a protective adhesive tape to a semiconductor wafer surface on which a pattern is formed.

(2) Description of the Related Art

In a conventional producing process of a semiconductor wafer, a back surface of a semiconductor wafer (hereinafter, simply referred to as "wafer") is processed using a mechanical method such as a grinding method and a polishing method, or a chemical method utilizing etching, and the thickness of the wafer is reduced. When the wafer is processed using such methods, in order to protect a surface on which a pattern is formed, a protective adhesive tape is joined to the surface.

That is, a wafer is transferred to a back grind process, and a surface thereof (pattern surface) is sucked and held by a chuck table and is ground by a grindstone. Herein, a stress is applied to the surface of the wafer due to the grinding operation, so that there is an adverse possibility that the pattern is damaged or contaminated. Therefore, a protective adhesive tape is joined to the surface.

In the case where the adhesive tape is joined to the surface of the wafer, generally, the adhesive tape is joined to the wafer from its end by rotating a roller and, then, an outer peripheral edge of the wafer is cut along the wafer by a cutting tool.

In recent years, there are increasing tendencies to thin the wafers. With the tendencies, the strength and rigidity of the wafer are deteriorated and, when wafers are processed or transferred, they are prone to be damaged. Further, handling thereof is difficult due to bending or warpage of the wafer. Therefore, there is a tendency that a thick, hard and rigid adhesive tape is used for increasing the strength of the wafer and suppressing the warpage thereof (see JP-A 2003-209084).

The thick and rigid adhesive tape described in the above publication which is used in recent years is advantageous in reinforcing the wafer. However, when an unnecessary adhesive tape after the adhesive tape is joined to the wafer surface and is cut out along the outer peripheral edge is to be wound, a cut portion of the unnecessary adhesive tape is concentrated on its center portion depending upon the winding force, and the adhesive tape shrinks in its width direction. As a result, in the wound adhesive tape, center portions thereof are superposed on each other on a winding roller, so that the widths thereof are varied and wrinkle is generated. If the adhesive tape is joined to the wafer in such a state, there is a problem that bubbles are generated between the adhesive tape and the wafer or that a continuous processing can not be continued due to meandering of the adhesive tape.

SUMMARY OF THE INVENTION

The present invention is made in view of the above circumstances, and it is an object of the present invention to provide a method and an apparatus for joining an adhesive tape to a surface of an article such as a wafer, cutting out the unnecessary adhesive tape and, then, winding up and collecting the unnecessary adhesive tape so that the unnecessary adhesive tape does not shrink in a width direction.

In order to achieve the above object, the present invention has the following configurations.

That is, the present invention provides an adhesive tape joining method for joining an adhesive tape to a surface of an article, cutting out the adhesive tape along an outer peripheral edge of the article and, then, collecting the unnecessary adhesive tape which has been cut out, and the method comprises the step of:

winding up and collecting the unnecessary adhesive tape so that the adhesive tape does not shrink at a cut portion thereof in a width direction.

According to the adhesive tape joining method of the present invention, the unnecessary adhesive tape is wound and collected so that the cut portion thereof does not shrink in the width direction; therefore, the width of the unnecessary adhesive tape becomes constant. Further, the unnecessary adhesive tape is wound without meander of the adhesive tape and generation of wrinkle or the like when being wound around a winding roller. Accordingly, it is possible to continuously join an adhesive tape to an article.

In the adhesive tape joining method of the present invention, preferably, the unnecessary adhesive tape is wound and collected while a tension is applied thereto in the width direction.

According to such a method, the unnecessary adhesive tape can be wound and collected so that the cut portion thereof does not shrink in the width direction; therefore, the width of the unnecessary adhesive tape becomes constant. Further, the unnecessary adhesive tape is wound without meander of the adhesive tape and generation of wrinkle or the like when being wound around a winding roller. Accordingly, it is possible to continuously join an adhesive tape to an article.

In the adhesive tape joining method of the present invention, preferably, the unnecessary adhesive tape is wound around at least one medium-thick cylindrical winding roller and is wound and collected so that the adhesive tape does not shrink at the cut portion thereof in the width direction.

According to such a method, the medium-thick cylindrical winding roller is used for winding up the unnecessary adhesive tape which has been cut out; therefore, it is possible to wind up the unnecessary adhesive tape so as not to shrink in a width direction by means of a series of processes.

In order to the above object, the present invention also has the following configurations.

That is, the present invention provides an adhesive tape joining apparatus for joining an adhesive tape to a surface of an article, cutting out the adhesive tape along an outer peripheral edge of the article and, then, collecting the unnecessary adhesive tape which has been cut out, the apparatus comprises:

a container for containing an article therein;

transport means for transporting the article from the container;

positioning means for mounting thereon the article transported by the transport means, and positioning the article;

an article holder for holding the positioned article;

a tape supply unit for supplying an adhesive tape onto the article mounted on the article holder;

a releasing mechanism for releasing the adhesive tape from a release liner;

a liner winding unit for winding up the release liner released by the releasing mechanism;

a joining mechanism for joining the adhesive tape supplied from the tape supply unit to a surface of the article;

adhesive tape cutting means for cutting out the adhesive tape joined to the article along an outer circumference of the article; and an unnecessary tape winding unit for winding up the unnecessary adhesive tape which has been cut out, and the unnecessary tape winding unit is provided with at least one medium-thick cylindrical winding roller around which the unnecessary adhesive tape is around so as not to shrink in a width direction.

According to the adhesive tape joining apparatus of the present invention, the unnecessary adhesive tape is wound and collected so that the cut portion thereof does not shrink in the width direction; therefore, the width of the unnecessary adhesive tape becomes constant. Further, the unnecessary adhesive tape is wound without meander of the adhesive tape and generation of wrinkle or the like when being wound around a winding roller. Accordingly, it is possible to continuously join an adhesive tape to an article. In addition, by changing the shape of the winding roller into a medium-thick cylindrical shape, the unnecessary adhesive tape can be wound without shrinkage in the width direction. Consequently, it is possible to use a conventional adhesive joining apparatus without major change of its specifications.

Here, examples of the medium-thick cylindrical winding roller may include a guide roller which transports and guides the unnecessary adhesive tape, a collecting bobbin which winds up and collects the unnecessary adhesive tape, and the like, each of which constitutes the unnecessary tape winding unit.

In the adhesive tape winding apparatus of the present invention, the medium-thick cylindrical winding roller has a radius of curvature in its circumferential side face curved from both ends of a rotation shaft thereof toward a center portion of the rotation shaft, in a range of 1,000 to 100,000 mm. Here, this radius of curvature R is preferably in a range of 1,000 to 80,000 mm, more preferably about 1,500 mm. With this configuration, upon winding up the unnecessary adhesive tape which has been cut out along the outer circumference of the article, the thick shaft portion of the shaft enters into the cut portion of the adhesive tape, so that the unnecessary adhesive tape can be wound so as not to shrink in the width direction.

Here, the winding roller may be made of, for example, metal, resin or the like.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENT

Hereinafter, description will be given of an embodiment of the present invention with reference to the drawings.

Figure 1:
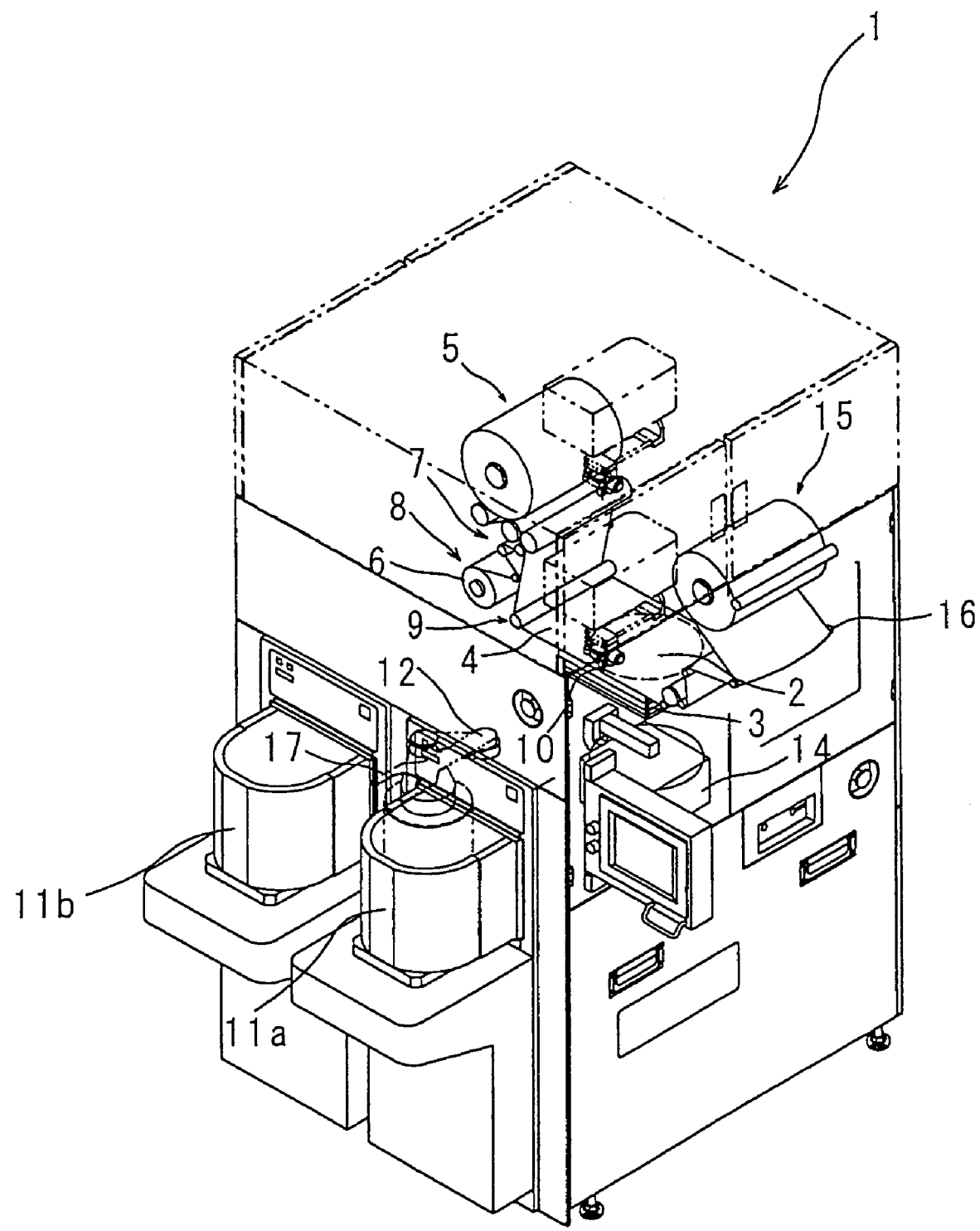
FIG. 1 is a schematic perspective view of one example of an embodiment of an adhesive tape joining apparatus according to the present invention.

As shown in FIG. 1, an adhesive tape joining apparatus 1 according to this embodiment mainly comprises wafer containers 11a, 11b for containing therein a wafer 2 which is an article to which an adhesive tape is joined; a robot arm 12 as transport means for transporting the wafer 2 from each of the wafer containers 11a, 11b; an alignment stage 14 for mounting thereon the wafer 2 transported by the robot arm 12 and positioning the wafer 2; a chuck table 3 as an article holder for holding the positioned wafer 2; a tape supply unit 5 for supplying an adhesive tape 4 to the wafer 2 mounted on the chuck table 3; a releasing mechanism 7 for releasing the adhesive tape 4 from a release liner 6, a liner winding unit 8 for winding up the release liner 6 released by the releasing mechanism 7, a joining mechanism 9 for joining the adhesive tape 4 supplied from the tape supply unit 5 onto the wafer 2; adhesive tape cutting means 10 for cutting out the adhesive tape 4 joined to the wafer 2 along an outer circumference of the wafer 2; and an unnecessary tape winding unit 15 for winding up the unnecessary adhesive tape 4. The unnecessary tape winding unit 15 is provided with one medium-thick cylindrical winding roller 16.

The wafer containers 11a, 11b can contain therein and mount thereon the plural wafers 2 in multiple stages. Herein, each of the wafers 2 is in a horizontal posture in which its pattern surface is directed upward.

The robot arm 12 is turned by a driving mechanism (not shown). The robot arm 12 is provided at its tip end with a horseshoe-shaped wafer holder 17. The wafer holder 17 is provided with a suction hole (not shown), so that the wafer 2 is vacuum-sucked from the back surface.

That is, the wafer holder 17 of the robot arm 12 moves rearward between the wafers 2 contained in the wafer containers 11a, 11b in the multiple stages and sucks and holds the wafer 2 from its back surface. The sucked and held wafer 2 is transported to the alignment stage 14 which is positioning means, the chuck table 3 and the wafer containers 11a, 11b in this order.

The alignment stage 14 positions the mounted wafer 2 on the basis of an orientation flat or the like.

The chuck table 3 positions the mounted wafer 2 on the basis of an orientation flat or the like, and covers the entire back surface of the wafer 2 and vacuum-sucks the wafer 2. That is, the chuck table 3 is provided at its outer circumferential region and central region with suction holes.

The chuck table 3 is provided with a plurality of grooves. A blade 20 of the adhesive tape cutting means 10, which will be described, is inserted into the grooves, and the adhesive tape 4 is cut along the outer peripheral edge of the wafer 2. The grooves have various outer shapes in accordance with the wafers 2 of different sizes. An initial position of the groove into which the blade 20 of the adhesive tape cutting means 10 is inserted is wide in its width provided in the radial direction of the chuck table 3, and the all of the grooves are connected to one another.

Figure 3:
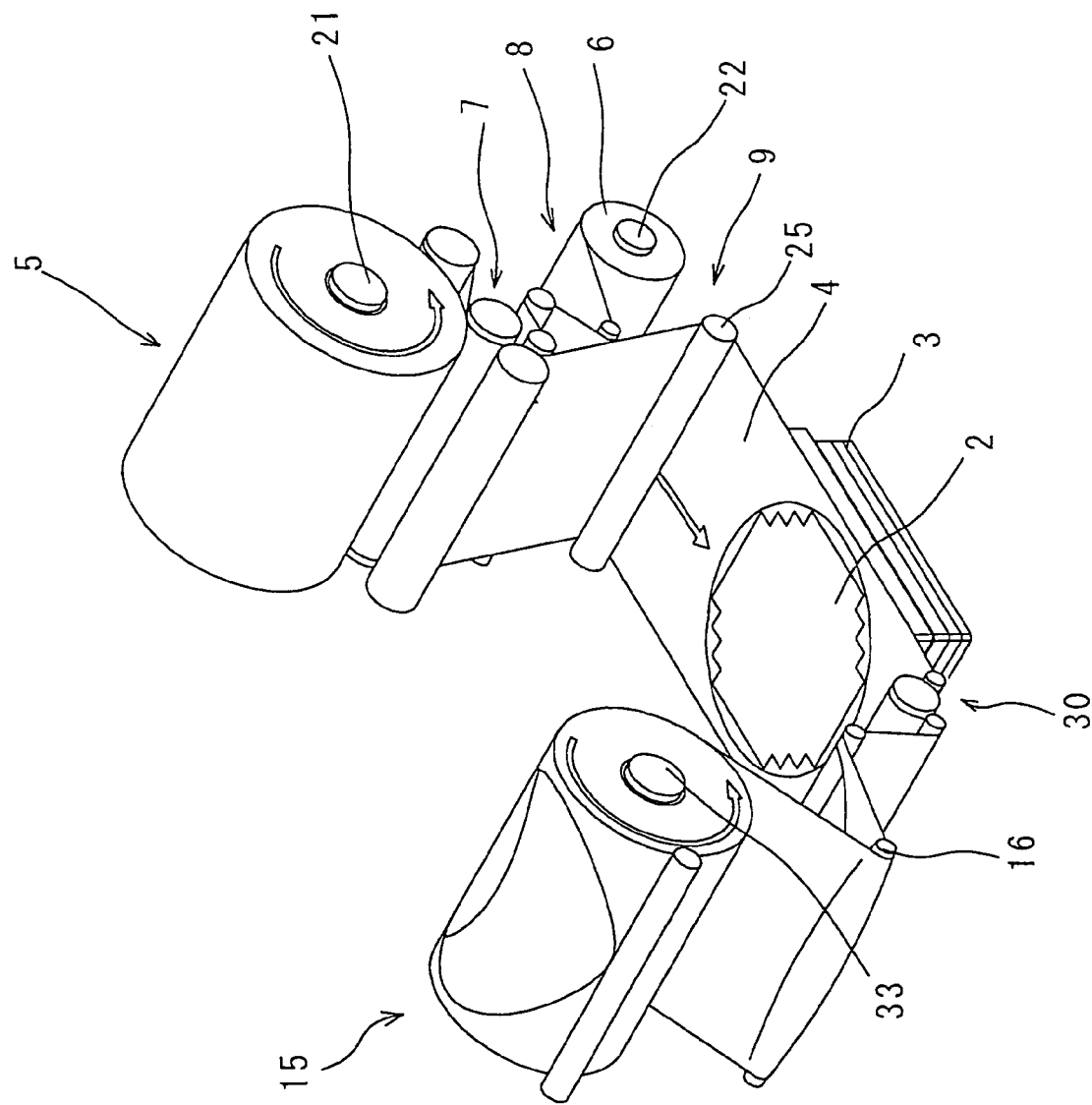
FIG. 3 is a schematic perspective view of a main part of the example of the embodiment of the adhesive tape joining apparatus according to the present invention.

As shown in FIG. 3, the tape supply unit 5 winds and guides the adhesive tape 4 with the release liner 6 unreeled from a tape bobbin 21 around and into the releasing mechanism 7 including a guide roller group. The tape supply unit 5 is rotatably supported by a vertical wall of an apparatus main body (not shown), and its rotation is limited through a brake mechanism or the like.

The liner winding unit 8 includes a collecting bobbin 22 which is associatively connected to a driving mechanism such as a motor, and a guide roller group rotatably supported by the vertical wall of the apparatus main body (not shown).

Figure 4:
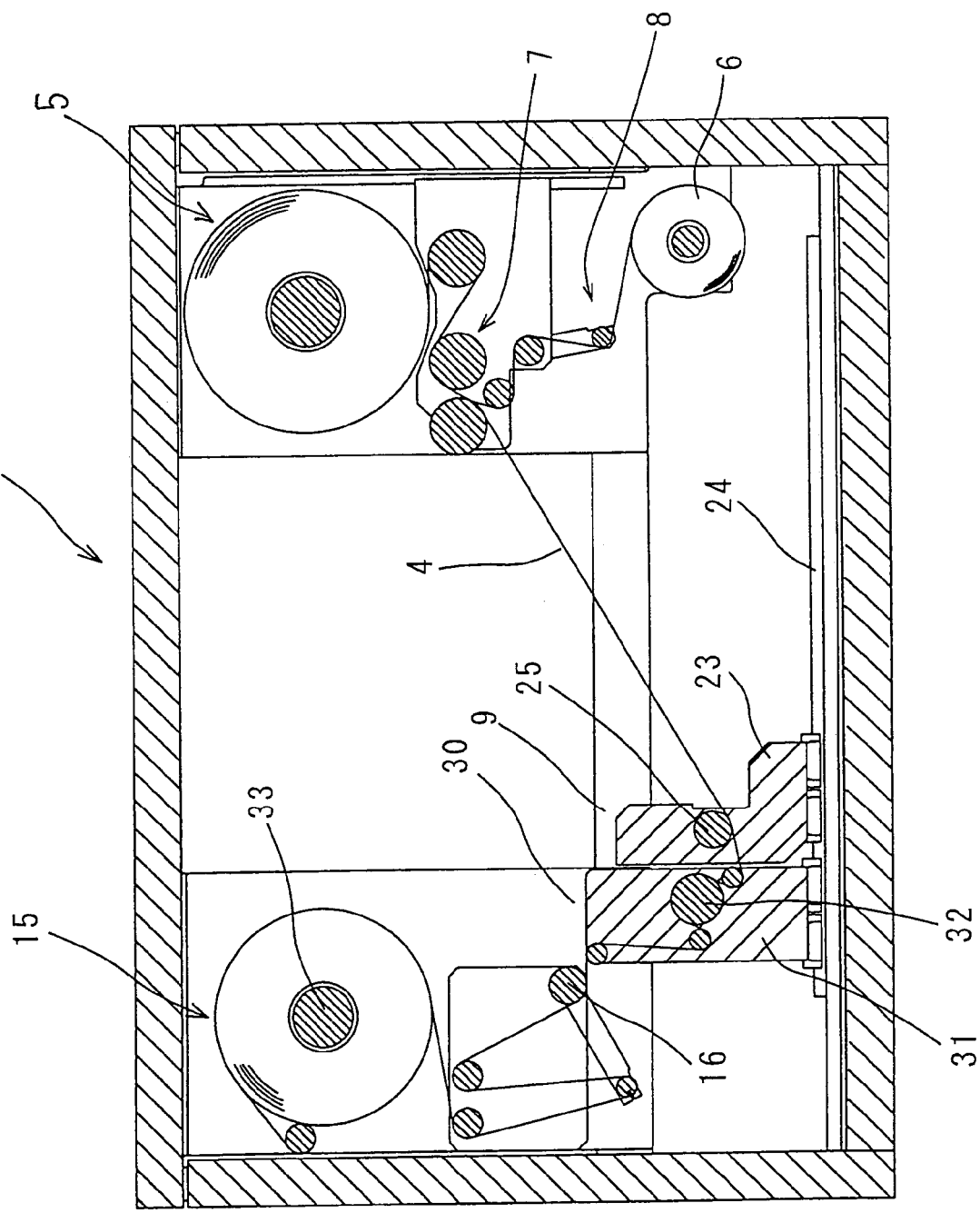
FIG. 4 illustrates a series of operations of the adhesive tape joining apparatus.

As shown in FIG. 4, the joining mechanism 9 is grasped by rails 24 of the apparatus main body so that a frame 23 of the joining mechanism 9 can slide in a tape-running direction. The joining mechanism 9 is associatively connected through a driving unit such as a motor (not shown). A joining roller 25 is rotatably supported by the frame 23, and vertically rocks by means of a cylinder (not shown) or the like. That is, the adhesive tape 4 is joined to the surface of the wafer 2 while the joining roller 25 presses the surface of the adhesive tape 4 and rotates.

Figure 2:
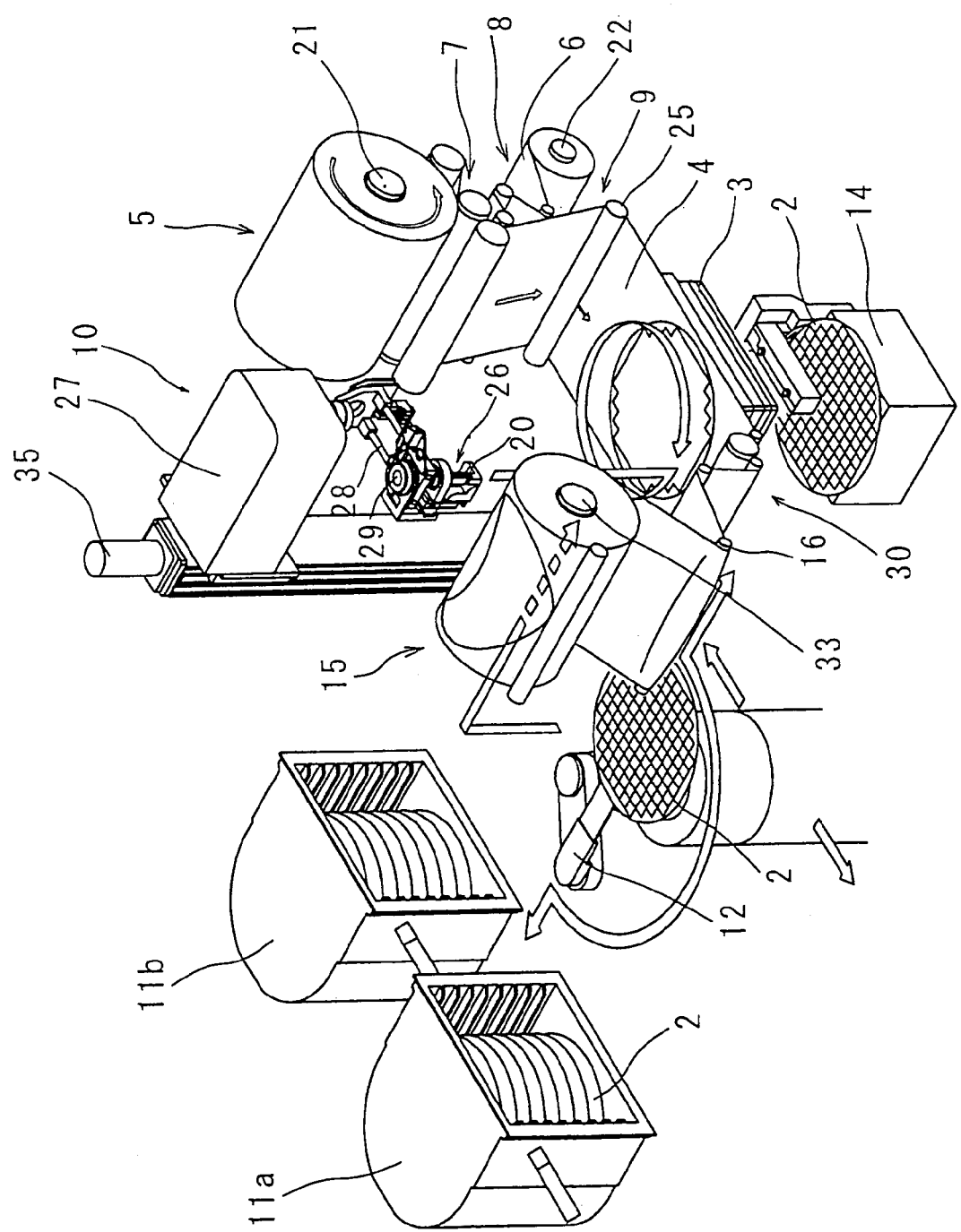
FIG. 2 is a schematic perspective view of a main part of the example of the embodiment of the adhesive tape joining apparatus according to the present invention.

As shown in FIG. 2, the adhesive tape cutting means 10 includes a cutter unit 26 which is attached to a ball shaft 35 in a vertically movable manner; a vertically driving unit 27 which vertically moves the cutter unit 26; and a control unit (not shown) for controlling the vertically driving unit 27.

The cutter unit 26 includes an arm 28 which is supported by the vertically driving unit 27 in a cantilever manner; a motor 29 mounted on an upper portion of a tip end of the arm 28; and the blade 20. One end of the blade 20 is connected to a rotation shaft of the motor 29 which penetrates the arm 28 downward, and the cutter of the blade 20 is attached downward such that the blade 20 can turn.

The vertically driving unit 27 moves vertically along the ball shaft 35. The ball shaft 35 is provided at its bottom with a stopper for limiting a position (height) of the lowermost portion of the vertically driving unit 27, although not shown.

The motor 29 transmits the rotation force to the blade 20 through the rotation shaft to turn the blade 20.

As shown in FIG. 4, an unnecessary tape separating mechanism 30 has a frame 31 which is grasped by the rails 24 of the apparatus main body so that the frame 31 can slide in the tape running direction, and is associatively connected through a driving unit such as a motor (not shown). A separating roller 32 is rotatably supported by the frame 31. The separating roller 32 vertically rocks by means of a cylinder (not shown). The separating roller 32 separates, from the wafer 2, the unnecessary adhesive tape 4 which has been cut out along the outer peripheral edge of the wafer 2.

A collecting bobbin 33 of the unnecessary tape winding unit 15 is pivotally supported by the vertical wall of the adhesive tape joining apparatus 1, and is associatively connected to a driving unit such as a motor. That is, if a predetermined amount of adhesive tape 4 is unreeled from the tape supply unit 5 and is supplied onto the wafer 2, the driving unit is operated and the unnecessary adhesive tape 4 which has been cut out is wound around the collecting bobbin 33.

One medium-thick cylindrical winding roller 16 is disposed between the collecting bobbin 33 and the unnecessary tape separating mechanism 30. With this configuration, the cut portion of the unnecessary adhesive tape 4 which has been cut out along the shape of the wafer 2 enters the thick shaft portion of the medium-thick cylindrical shape. The unnecessary adhesive tape 4 is wound around the collecting bobbin 33 so that the adhesive tape 4 is stretched in such a manner that a portion which is not cut does not shrink in the width direction. Therefore, the unnecessary tape wound around the collecting bobbin 33 does not meander and is not concentrated on the center portion when it is wound, and all of the adhesive tape 4 supplied from the tape supply unit 5 of the adhesive tape 4 can be wound and collected. Consequently, it is possible to continuously join the adhesive tape 4 to the surface of the wafer 2.

Figure 5:
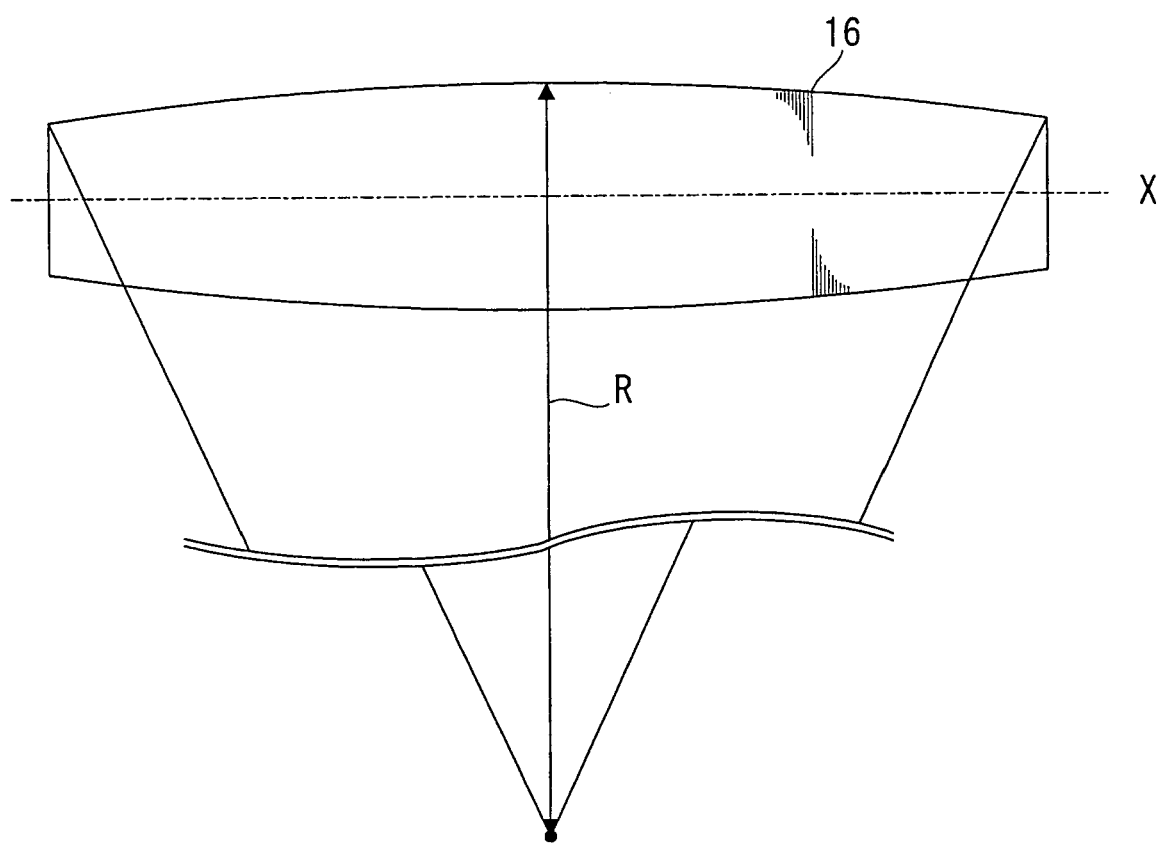
FIG. 5 is a plan view of a winding roller.

As shown in FIG. 5, the medium-thick cylindrical winding roller 16 has a shape in that its circumferential side face swells so as to be curved from both ends of a rotation shaft X toward a center portion of the rotation shaft X. Here, a radius of curvature R in the circumferential side face of the winding roller 16 can be appropriately changed in accordance with the rigidity, thickness and the like of the adhesive tape 4. The radius of curvature R is preferably in a rage of 1,000 to 100,000 mm, more preferably about 1,500 mm. In addition, the medium-thick cylindrical winding roller 16 can be made of various materials, for example, metals such as stainless steel, resins and the like. Although one winding roller 16 is disposed in this embodiment, a plurality of medium-thick cylindrical winding rollers may be disposed, and the number of winding rollers can appropriately be selected in accordance with rigidity and thickness of the adhesive tape.

Next, description will be given of a series of operations for joining the hard and thick adhesive tape 4 to the surface of the wafer 2 with reference to the drawings. The plural wafers 2 are contained in the wafer containers 11a, 11b in multiple stages. One of the wafers 2 is taken out from one of the wafer containers 11a, 11b by the robot arm 12. Herein, the wafer holder 17 of the robot arm 12 is inserted into the gap between the wafers 2 in the wafer containers 11a and 11b. The robot arm 12 sucks and holds the wafer 2 by the wafer holder 17 from its back surface, and the wafer 2 is transported to the alignment stage 14.

The wafer 2 mounted on the alignment stage 14 is positioned on the basis of the orientation flat or a notch. After the wafer 2 is positioned, the back surface of the wafer 2 is sucked and held by the robot arm 12 and the wafer 2 is transported to the chuck table 3.

The wafer 2 mounted on the chuck table 3 is positioned, and is sucked and held. Herein, the joining mechanism 9 of the adhesive tape 4 and the tape separating mechanism 30 are located at the initial position, and the cutter unit 26 is located at an upper stand-by position.

When the positioning of the wafer 2 is completed, the joining roller 25 of the joining mechanism 9 of the adhesive tape 4 is rocked downward, the joining roller 25 presses the adhesive tape 4 and, in this state, the joining roller 25 rotates on the wafer 2 in a direction opposite to the tape running direction, so that the adhesive tape 4 is uniformly joined to the entire surface of the wafer 2. When the joining mechanism 9 of the adhesive tape 4 reaches the end position, the joining roller 25 moves upward.

Next, the cutter unit 26 is lowered to a cut position of the adhesive tape, and the blade 20 sticks into the adhesive tape 4 and penetrates the same. Herein, the blade 20 which has penetrated the adhesive tape 4 is stopped at a predetermined position (height). The blade 20 which has stopped at the predetermined position moves along the groove provided in the chuck table 3. That is, the blade 20 cuts out the adhesive tape 4 along the outer peripheral edge of the wafer 2. Herein, a tension is applied to the adhesive tape 4 by the joining mechanism 9 and the unnecessary tape separating mechanism 30.

After the adhesive tape 4 is cut, the cutter unit 26 moves upward and returns to the stand-by position.

Next, the unnecessary tape separating mechanism 30 winds up the unnecessary adhesive tape 4 which has been cut on the wafer 2 and separates the unnecessary adhesive tape 4 from the wafer 2 while moving on the wafer 2 in a direction opposite to the tape running direction.

When the unnecessary tape separating mechanism 30 reaches the end position of the separating operation, the unnecessary tape separating mechanism 30 and the joining mechanism 9 move in the tape running direction, and return to the initial position. Herein, a tension is applied to the unnecessary adhesive tape 4 by the medium-thick cylindrical winding roller 16 in the width direction, and the unnecessary adhesive tape 4 is wound around the collecting bobbin 33 so as not to shrink in the width direction. With this operation, the adhesive tape 4 is unreeled from the tape supply unit 5 together with a predetermined amount of release liner 6 and, when the adhesive tape 4 passes through the releasing mechanism 7, the release liner 6 and the adhesive tape 4 are separated from each other. With the above procedure, the series of operations for joining the adhesive tape 4 to the surface of the wafer 2 is completed.

As described above, according to the present invention, when the adhesive tape is joined to the wafer surface, the adhesive tape does not shrink or deform in the width direction after it is cut out, so that the joining property of the adhesive tape to the wafer can be stabilized. Further, the unnecessary adhesive tape which has been cut out can neatly be wound.

In the above embodiment, only the winding roller 16 is formed into a medium-thick cylindrical shape; however, the collecting bobbin 33 may also be formed into a medium-thick cylindrical shape.

The present invention may be embodied in other specific forms without departing from the sprit or essential attributes thereof and, accordingly, reference should be made to the appended claims, rather than to the foregoing specification, as indicating the scope of the invention.

What is claimed is:

1. An adhesive tape joining apparatus for joining an adhesive tape to a surface of an article, cutting out the adhesive tape along an outer peripheral edge of the article and, then, collecting the unnecessary adhesive tape which has been cut out, the apparatus comprising:
    a container for containing an article therein;
    transport means for transporting the article from the container;
    positioning means for mounting thereon the article transported by the transport means, and positioning the article;
    an article holder for holding the positioned article;
    a tape supply unit for supplying an adhesive tape onto the article mounted on the article holder;
    a releasing mechanism for releasing the adhesive tape from a release liner;
    a liner winding unit for winding up the release liner released by the releasing mechanism;
    a joining mechanism for joining the adhesive tape supplied from the tape supply unit to a surface of the article;
    adhesive tape cutting means for cutting out the adhesive tape joined to the article along an outer circumference of the article; and
    an unnecessary tape winding unit for winding up the unnecessary adhesive tape which has been cut out, wherein
    the unnecessary tape winding unit is provided with at least one medium-thick cylindrical winding roller; and
    the medium-thick cylindrical winding roller has a circumferential side face swelled so as to be curved from both ends of a rotation shaft toward the center portion of the rotation shaft; and
    a cut portion of the adhesive tape is arranged in the curved portion of the roller, and the non-cut portion is wound to both ends of the rotation shaft while the adhesive tape is pulled so as not to shrink towards the center portion of the rotation shaft of the roller.

2. The adhesive tape joining apparatus according to claim 1, wherein
    the medium-thick cylindrical winding roller is a guide roller which transports and guides the unnecessary adhesive tape.

3. The adhesive tape joining apparatus according to claim 1, wherein
    the medium-thick cylindrical winding roller is a collecting bobbin which winds up and collects the unnecessary adhesive tape.

4. The adhesive tape joining apparatus according to claim 1, wherein
    the medium-thick cylindrical winding roller has a radius of curvature in its circumferential side face curved from both ends of a rotation shaft thereof toward a center portion of the rotation shaft, in a range of 1,000 to 100,000 mm.

5. The adhesive tape joining apparatus according to claim 1, wherein
    the medium-thick cylindrical winding roller includes a shaft made of metal.

6. The adhesive tape joining apparatus according to claim 1, wherein
    the medium-thick cylindrical winding roller includes a shaft made of resin.

* * * * *